United States Patent
Chen et al.

(10) Patent No.: US 10,706,800 B1
(45) Date of Patent: Jul. 7, 2020

(54) BENDABLE FLEXIBLE ACTIVE MATRIX DISPLAY PANEL

(71) Applicant: a.u. Vista, Inc., Irvine, CA (US)

(72) Inventors: Yung-Chih Chen, Hsinchu (TW); Fang-Chen Luo, Hsinchu (TW)

(73) Assignee: A.U. VISTA, INC., Irvine, CA (US)

( * ) Notice: Subject to any disclaimer, the term of this patent is extended or adjusted under 35 U.S.C. 154(b) by 0 days.

(21) Appl. No.: 16/460,417

(22) Filed: Jul. 2, 2019

(51) Int. Cl.
*G09G 3/36* (2006.01)
*G09G 3/3225* (2016.01)
*H01L 27/12* (2006.01)

(52) U.S. Cl.
CPC ......... *G09G 3/3648* (2013.01); *G09G 3/3225* (2013.01); *H01L 27/124* (2013.01); *G09G 2310/027* (2013.01); *G09G 2310/0286* (2013.01); *G09G 2310/0291* (2013.01); *G09G 2310/0297* (2013.01)

(58) Field of Classification Search
CPC ......... G09G 3/3648; G09G 2310/0291; G09G 2310/0286; G09G 3/3225; G09G 2310/027; G09G 2310/0297; H01L 27/124
See application file for complete search history.

(56) References Cited

U.S. PATENT DOCUMENTS

| | | | |
|---|---|---|---|
| 9,318,475 B2 | 4/2016 | Bibl et al. | |
| 2013/0221229 A1* | 8/2013 | Jagannathan | B05D 3/12 250/366 |
| 2014/0375704 A1* | 12/2014 | Bi | G09G 3/3275 345/694 |
| 2016/0071463 A1* | 3/2016 | Takahashi | G09G 3/3225 345/76 |
| 2019/0197960 A1* | 6/2019 | Kim | G09G 3/3275 |
| 2019/0342564 A1* | 11/2019 | Kurokawa | H04N 19/42 |

FOREIGN PATENT DOCUMENTS

| | | |
|---|---|---|
| CN | 108376536 A | 8/2018 |
| TW | 200719314 A | 5/2007 |
| TW | 200949345 A | 12/2009 |

* cited by examiner

*Primary Examiner* — Muhammad N Edun
(74) *Attorney, Agent, or Firm* — Locke Lord LLP; Tim Tingkang Xia, Esq.

(57) ABSTRACT

A display module includes a flexible and bendable display panel defining a display area and a peripheral area thereon, and a driving module disposed in the peripheral area. The driving module includes a first micro-chip, multiple second micro-chips, a transistor-based shift register circuit and a transistor-based demultiplexer (de-MUX) circuit. The first micro-chip provides the functions of image receiver, level shift and gamma buffer. Each of the second micro-chips provides the functions of latch, digital to analog converter and output buffer. The transistor-based shift register circuit generates shift register output signals for the second micro-chips. The transistor-based de-MUX receives the analog data signals from the second micro-chips and send the analog data signals to a plurality of data lines.

14 Claims, 20 Drawing Sheets

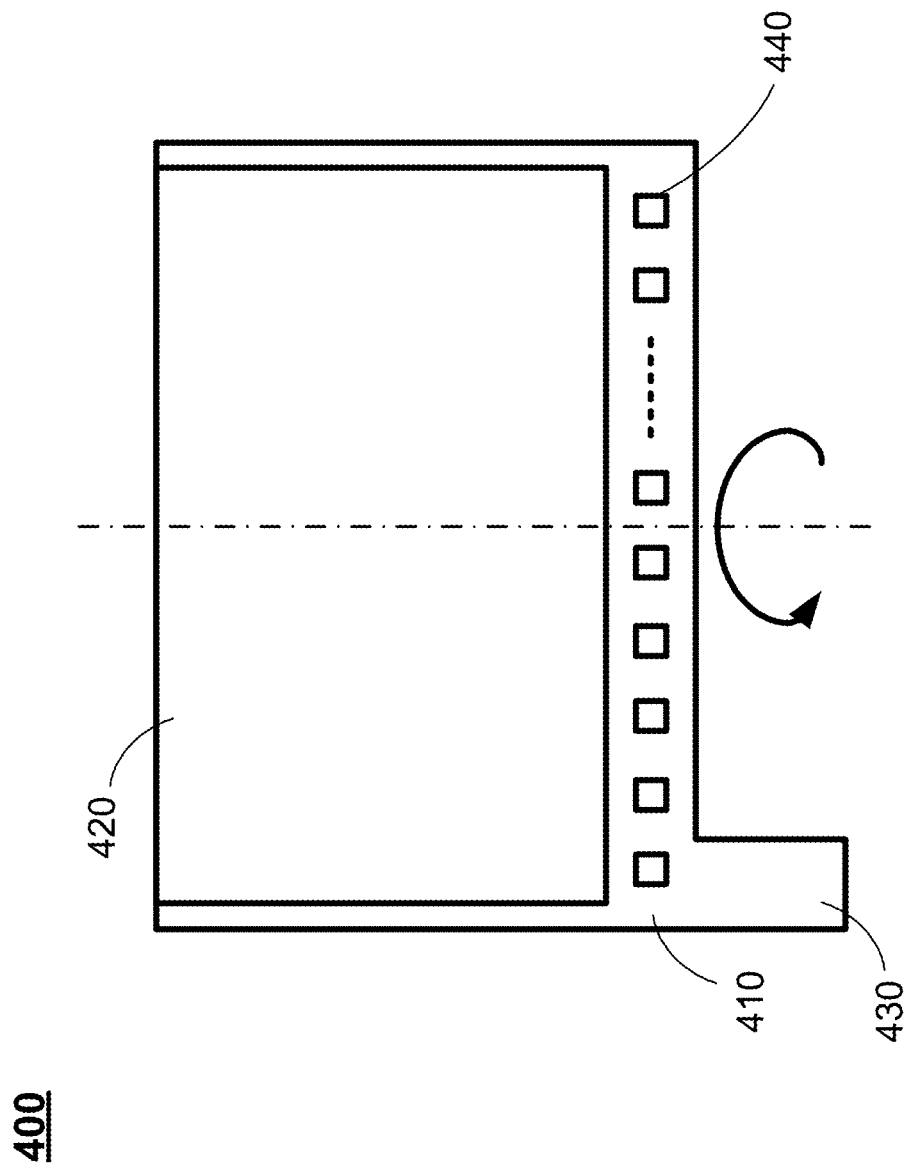

|   | u-chipA | | | u-chipB | | | u-chip size |
|---|---------|---|---|--------|---|---|-------------|
|   | process | size | number | process | size | number | |
| 1 | 55nm | 20% | 4 | 55nm | 20% | 1 | 20% |
| 2 | 55nm | 8% | 10 | 18nm | 8% | 1 | 8% |

FIG. 12

BENDABLE FLEXIBLE ACTIVE MATRIX DISPLAY PANEL

FIELD

The disclosure relates generally to display technology, and more particularly to a bendable flexible active matrix display panel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Generally, a display panel may include one or more integrated circuits (ICs), as the data driving chips that provide driving signals to the pixels of the display panel. Typically, the ICs may be disposed in a peripheral non-display area on the display panel. However, when the display panel is a flexible or bendable display panel, the disposition of the ICs may affect the flexibility and bendability (i.e., the bending ability) of the bendable display panel.

Therefore, a heretofore unaddressed need exists in the art to address the aforementioned deficiencies and inadequacies.

SUMMARY

One aspect of the disclosure relates to a display module, which includes: a display panel defining a display area and a peripheral area thereon, wherein the display panel is flexible and bendable; and a driving module disposed in the peripheral area, comprising: a first micro-chip configured to receive an image signal and a control signal, to generate digital data signals based on the image signal, and to generate demultiplexer (de-MUX) control signals and gamma voltage signals based on the control signal; a plurality of second micro-chips, coupled to the first micro-chip and sequentially coupled to one another, configured to receive the digital data signals and the gamma voltage signals from the first micro-chip, and to generate analog data signals based on the digital data signals; a transistor-based shift register circuit coupled to the first micro-chip and the second micro-chips, configured to generate shift register output signals for the second micro-chips; a transistor-based de-MUX circuit coupled to the first micro-chip and the second micro-chips, configured to receive the analog data signals from the second micro-chips and send the analog data signals to a plurality of data lines, wherein the first micro-chip and the second micro-chips are disposed in a straight line in the peripheral area, each of the first micro-chip and the second micro-chips has a width W along the straight line, and a distance D exists between two adjacent chips of the first micro-chip and the second micro-chips along the straight line.

In certain embodiments, the display panel is an active matrix display panel.

In certain embodiments, a bendability of the display panel is determined by the width W and the distance D.

In certain embodiments, the first micro-chip comprises: an image receiver module configured to receive a power voltage, the image signal and the control signal; a level shift module configured to generate the digital data signals and the de-MUX control signals; and a gamma buffer module configured to generate the gamma voltage signals.

In certain embodiments, each of the second micro-chips comprises: a latch module configured to receive the power voltage, the control signal, the digital data signal outputted by the first micro-chip and the shift register output signals; a digital to analog converter (DAC) module configured to receive the gamma voltage signals and to convert the digital data signals to the analog data signals; and an output buffer module configured to buffer the analog data signals for the de-MUX circuit.

In certain embodiments, the transistor-based shift register circuit comprises a plurality of thin-film transistor (TFT)-based shift registers, and each of the TFT-based shift registers is configured to sequentially output a corresponding output signal G(n) of the shift register output signals, wherein n is a positive integer indicating a corresponding stage of each of the TFT-based shift registers.

In certain embodiments, each of the TFT-based shift registers comprises: a first transistor having a first end, a second end and a control end, wherein the first end and the control end is configured to receive a previous corresponding output signal G(n−1) of a previous TFT-based shift register, and the second end is electrically connected to a node; a second transistor having a first end, a second end and a control end, wherein the first end is configured to receive a clock signal, the second end is an output end configured to output the corresponding output signal G(n), and the control end is electrically connected to the node; a third transistor having a first end, a second end and a control end, wherein the first end is electrically connected to the node, the second end is grounded, and the control end is configured to receive a next corresponding output signal G(n+1) of a next TFT-based shift register; and a fourth transistor having a first end, a second end and a control end, wherein the first end is electrically connected to the output end, the second end is grounded, and the control end is configured to receive the next corresponding output signal G(n+1) of the next TFT-based shift register.

In certain embodiments, the transistor-based MUX circuit comprises a plurality of thin-film transistor (TFT) switches, each of the TFT switches has a first end connected to a corresponding one of the second micro-chips to receive the analog data signals as the input signals of the transistor-based de-MUX circuit, a second end connected to a corresponding one of the data lines, and a control end connected to the first micro-chip to receive one of the MUX control signals.

In certain embodiments, the first micro-chip is manufactured by a first lithography process, and the second micro-chips is manufactured by a second lithography process.

In certain embodiments, the second lithography process is an advanced lithography process superior to the first lithography process, such that the first micro-chip and the second micro-chips have about the same width W.

In certain embodiments, the second lithography process is a 18-nm lithography process, and the first lithography process is a 55-nm lithography process.

In certain embodiments, the display panel is a liquid crystal display (LCD) panel.

In certain embodiments, the display panel is an organic light emitting diode (OLED) display panel.

Another aspect of the disclosure relates to a portable device, which has the display module as described above.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 4A schematically shows a portion of a display module having multiple driver ICs according to certain embodiments of the present disclosure.

FIG. 12 shows a table of the micro-chip sizes and the corresponding lithography processes of the micro-chips A and B according to certain embodiments of the present disclosure.

DETAILED DESCRIPTION OF THE DISCLOSURE

Figure 1:
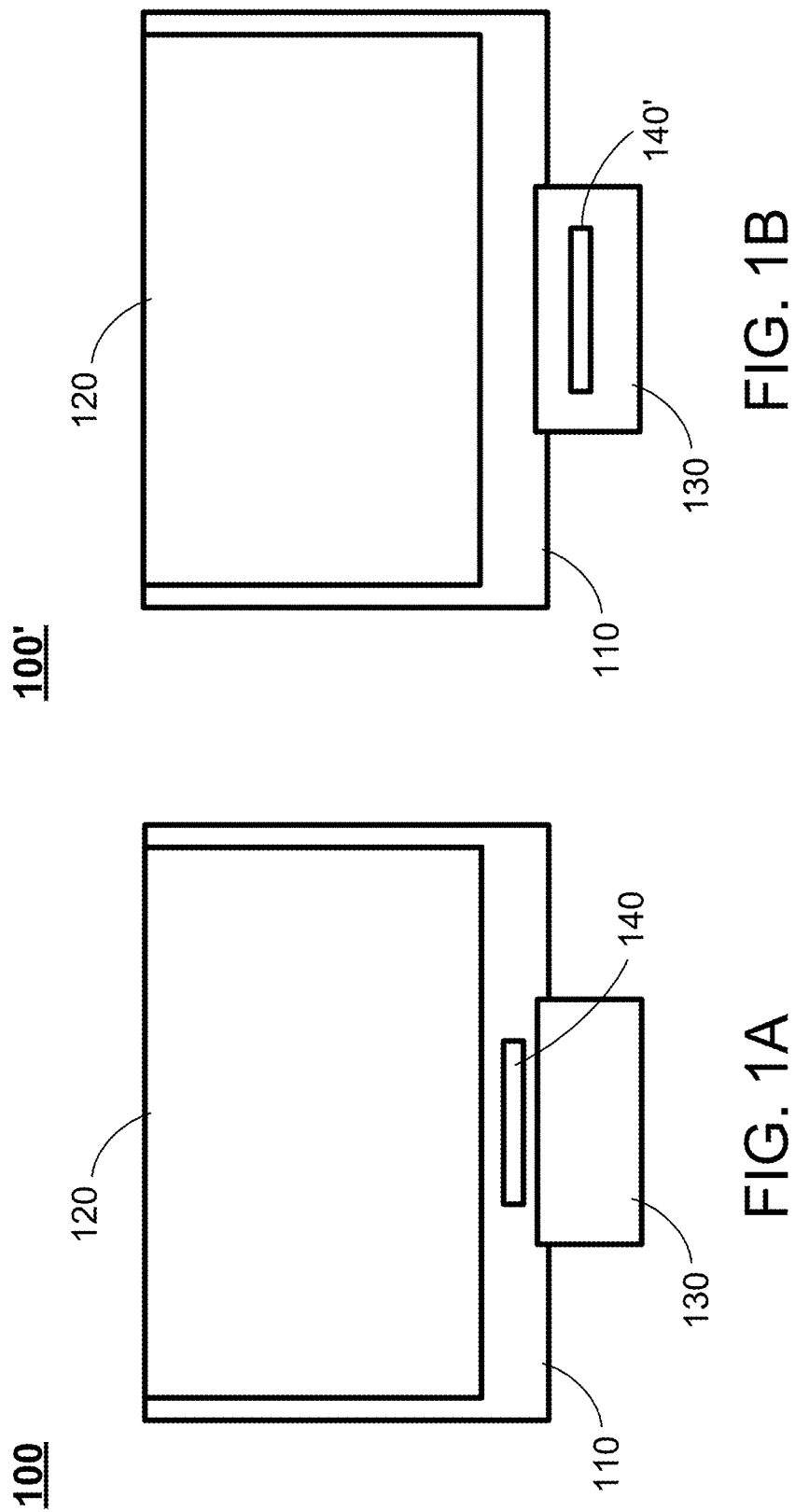
FIG. 1A schematically shows a portion of a display module according to certain embodiments of the present disclosure.
FIG. 1B schematically shows a portion of a display module according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a wireless display panel with multi-channel data transmission and a display device using the same.

As discussed above, a display panel may include one or more driver ICs as the data driving chips that provide driving signals to the pixels of the display panel. For example, FIGS. 1A and 1B schematically show two display modules according to certain embodiments of the present disclosure. Specifically, the only difference between the display module 100 as shown in FIG. 1A and the display module 100' as shown in FIG. 1B exists in the location of the driver IC. Using FIG. 1A as an example, the display module 100 has a display panel which defines a peripheral area 110 and a display area 120, and a flexible film 130 and the driver IC 140 are disposed on the peripheral area 110. The flexible film 130 includes connecting bus lines (not shown) for the driver IC 140. In certain embodiments, the display panel is disposed on a glass substrate, and the driver IC 140, which is disposed in the peripheral area 110, is a chip-on-glass (COG) driver IC. In comparison, in the display module 100' as shown in FIG. 1B, the driver IC 140' is disposed on the flexible film 130, forming a chip-on-film (COF) driver IC. In certain embodiments, each of the display modules 100 and 100' as shown in FIGS. 1A and 1B can be a liquid crystal display (LCD) panel or an organic light-emitting diode (OLED) display panel.

Figure 2:
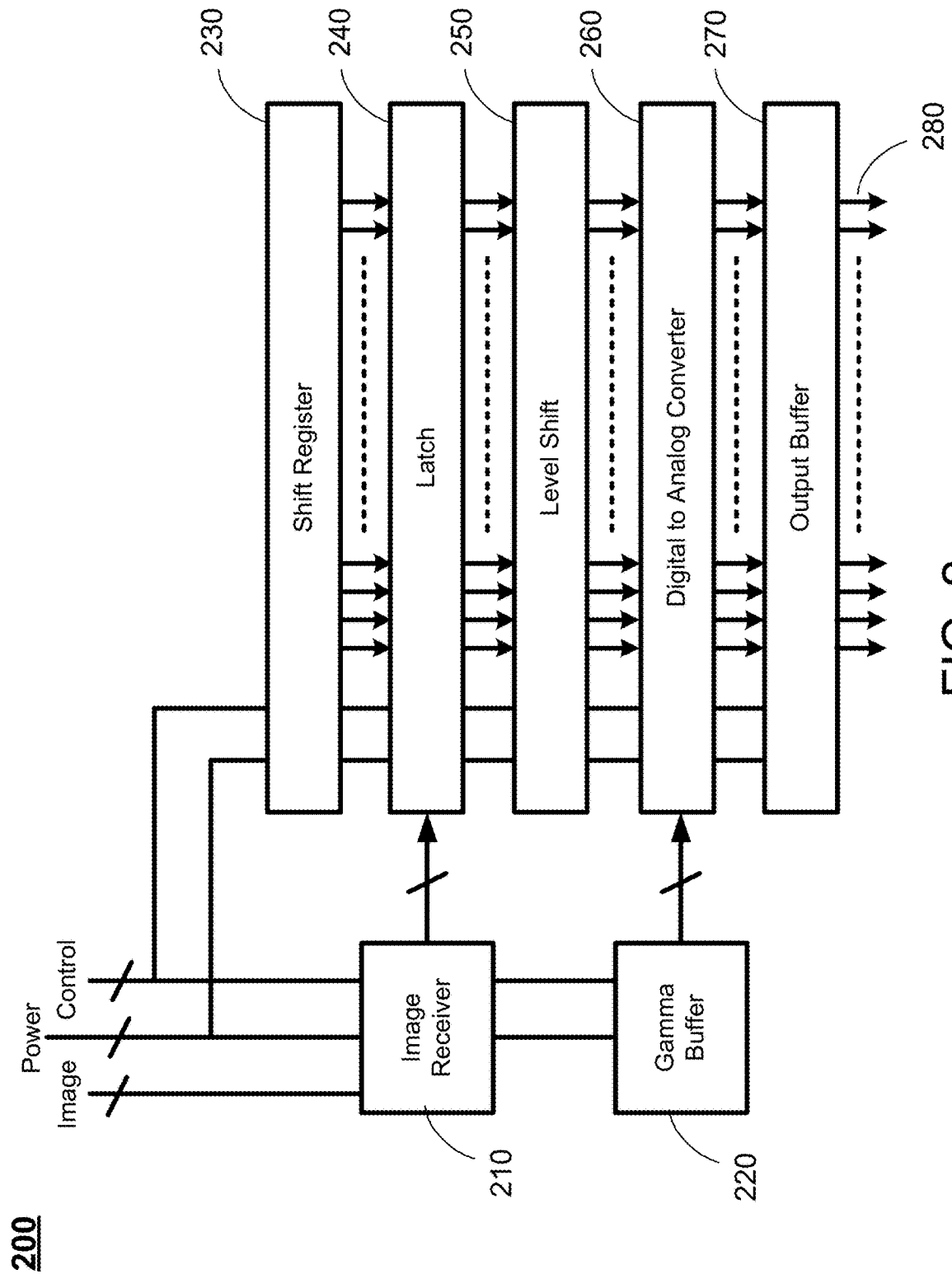
FIG. 2 schematically shows a function block diagram of a driver IC of a display module according to certain embodiments of the present disclosure.

FIG. 2 schematically shows a function block diagram of a driver IC of a display module according to certain embodiments of the present disclosure. Specifically, as shown in FIG. 2, the driver IC 200 includes multiple modules that provide different functions, including the image receiver module 210, the gamma buffer module 220, the shift register module 230, the latch module 240, the level shift module 250, the digital to analog converter (DAC) module 260, and the output buffer module 270 that output the data signals to the data lines 280.

Figure 3:
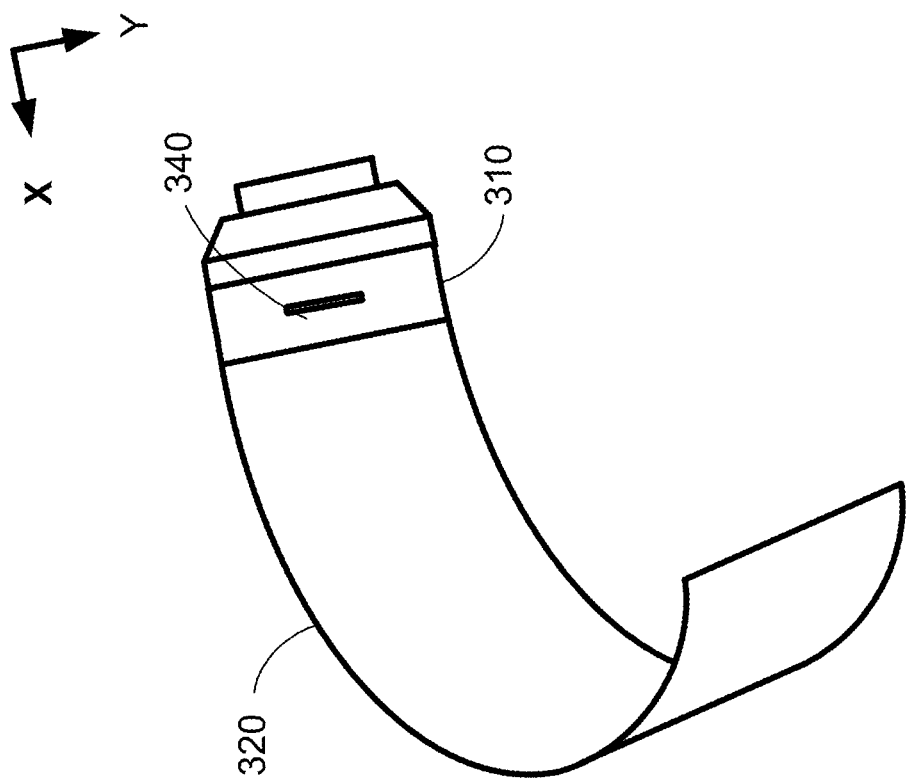
FIG. 3 schematically shows a flexible display panel according to certain embodiments of the present disclosure.

As discussed above, when the display panel is a flexible or bendable display panel, the disposition of the ICs may affect the flexibility and bendability of the bendable display panel. For example, FIG. 3 schematically shows a flexible display panel according to certain embodiments of the present disclosure. As shown in FIG. 3, instead of forming on a glass substrate, the flexible display panel 300 is formed on a flexible film substrate, such that the display area 320 may be flexible and bendable along its length direction X. However, the flexible display panel 300 has only one driver IC 340 disposed along its width direction Y, which affects the flexibility and bendability of the display panel 300 along the width direction Y.

Figure 4B:
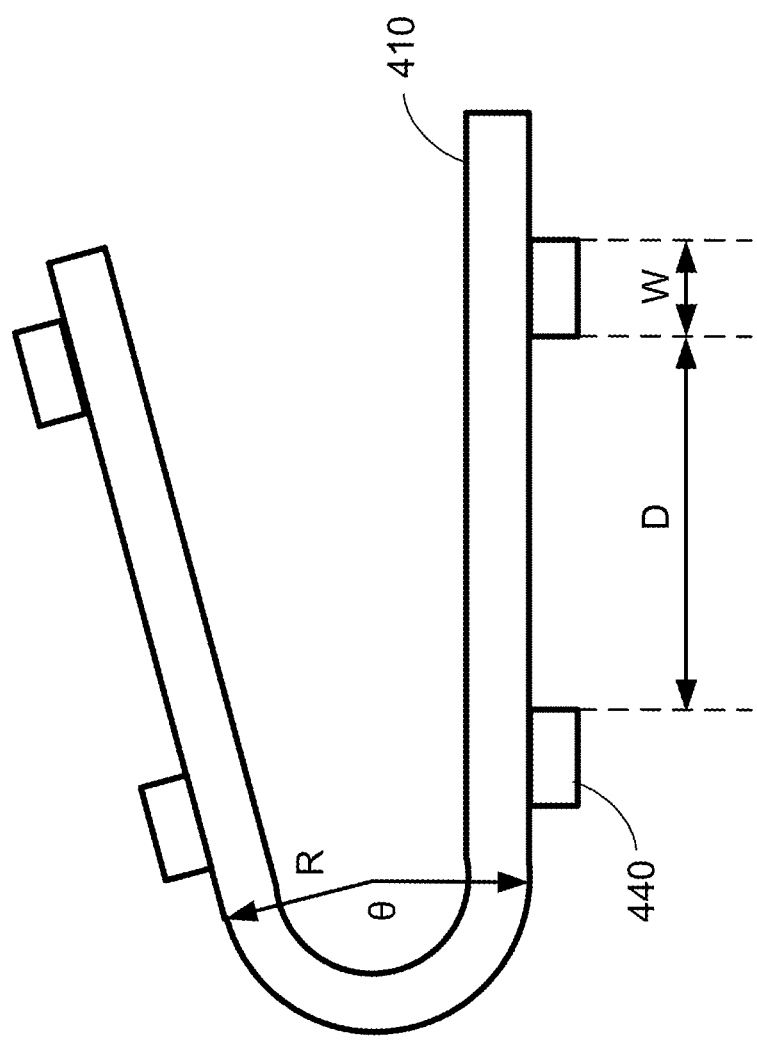
FIG. 4B schematically shows the display module as shown in FIG. 4A in a bending state according to certain embodiments of the present disclosure.

In view of the above deficiencies, one way to allow the display panel to be more flexible is to provide multiple driver ICs. For example, FIGS. 4A and 4B show a display module, which provides multiple driver ICs. As shown in FIG. 4A, the display module 400 has a flexible display panel, which defines a peripheral area 410 and a display area 420, and the flexible film 430 and the driver ICs 440 are disposed in the peripheral area 410. Specifically, the flexible display panel is disposed on a flexible film as the substrate, and the driver ICs 440 are disposed in the peripheral area 410 along its width direction (i.e., the horizontal direction as shown in FIG. 4A). In certain embodiment, each driver IC 440 may be a micro-chip (also known as a µ-chip). As shown in FIG. 4B, when the display module 400 is in a bending state along the width direction, the flexibility and bendability of the display panel 400 is determined by the width W of each driver IC 440 and the distance D between two adjacent driver ICs 440. More specifically, in order to improve the flexibility and bendability of the display panel 400, the width W of each driver IC 440 may be smaller, and the distance D between the two adjacent driver ICs 440 may be larger.

As shown in FIG. 4A, the display module 400 includes multiple driver ICs 440. In certain embodiments, the driver ICs 440 may include multiple micro-chips which provide the same functions as the single driver IC 240 as shown in FIG. 2. In other words, each of the driver ICs 440 may include all the modules provided in the function block as shown in FIG. 3. In this case, however, the chip size may not be reduced significantly unless the total number of the driver ICs 440 is significantly increased. For example, when the display module 400 includes five driver ICs 440, the width W of each of the five driver ICs 440 will be more than 20% of the width of the single driver IC 240 as shown in FIG. 2.

Figure 5A:
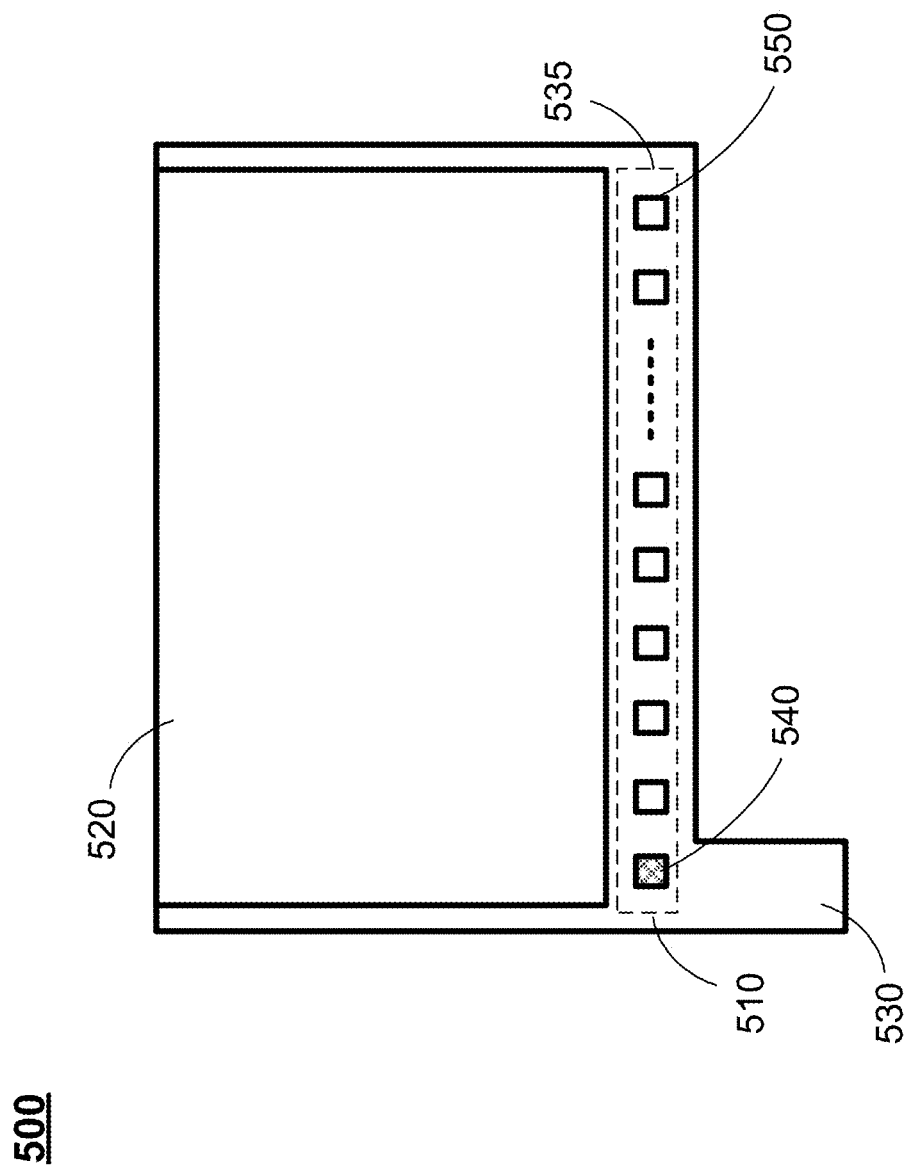
FIG. 5A schematically shows a portion of a display module having multiple driver ICs according to certain embodiments of the present disclosure.
Figure 5B:
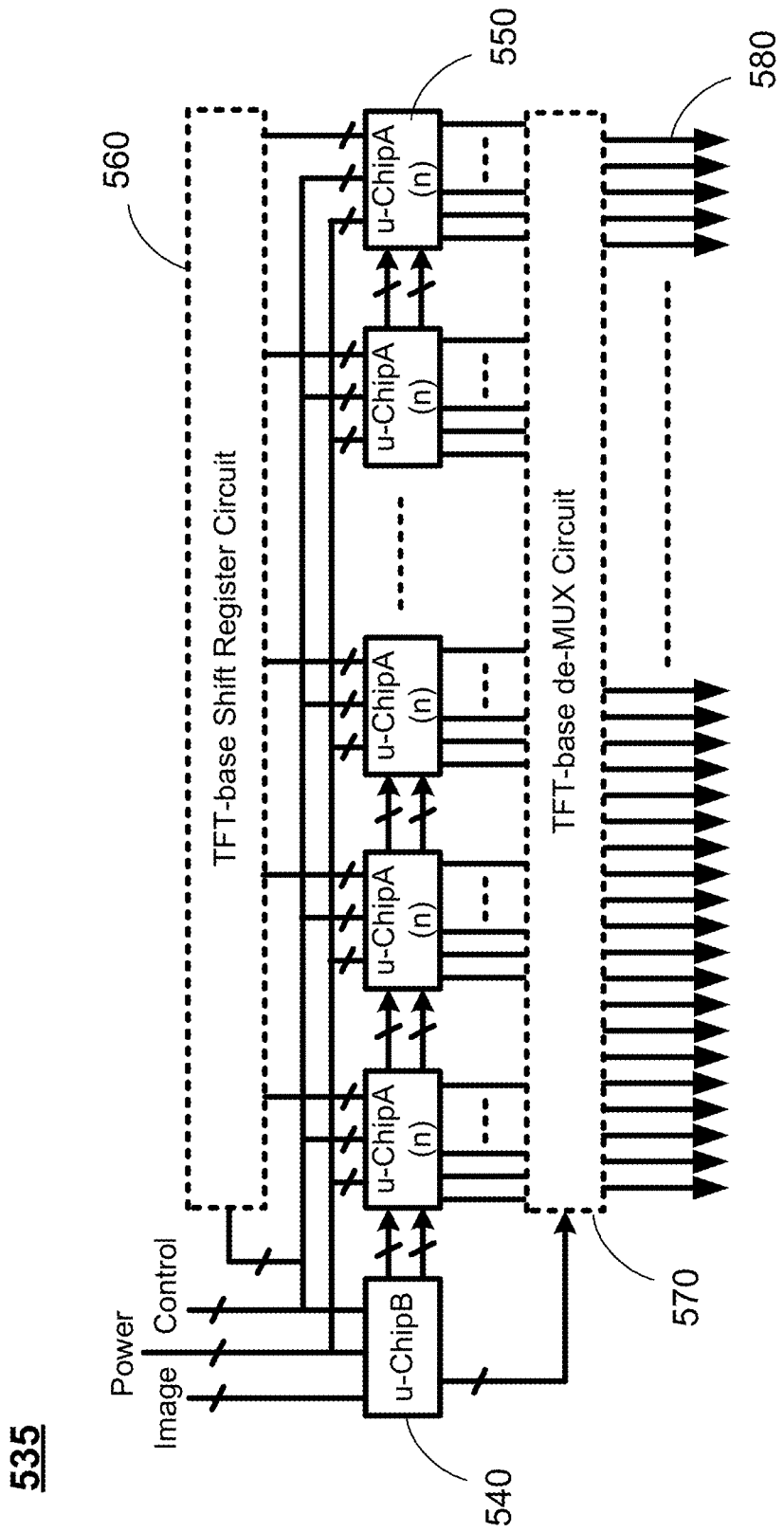
FIG. 5B schematically shows the driving module of the display panel as shown in FIG. 5A according to certain embodiments of the present disclosure.

In view of the above deficiencies, one aspect of the disclosure relates to a display module, which provides two types of micro-chips, and each type of micro-chips may be provided with reduced functionalities, such that the chip size can be minimized. For example, FIGS. 5A and 5B show a display module, which provides multiple driver ICs. As shown in FIG. 5A, the display module 500 has a flexible display panel, which defines a peripheral area 510 and a display area 520, and the flexible film 530 is disposed in the peripheral area 510. Further, a driver module 535 is also disposed in the peripheral area 510, and the driver module 535 includes two types of micro-chips 540 and 550 disposed along a straight line. As shown in FIG. 5B, the display module 535 includes one first micro-chip (also known as a micro-chip B) 540 and multiple second micro-chips (also known as micro-chips A) 550. Moreover, to further reduce the size of the micro-chips 540 and 550, the driver module 535 further includes a TFT-based shift register circuit 560 and a TFT-based de-MUX circuit 570.

Figure 6B:
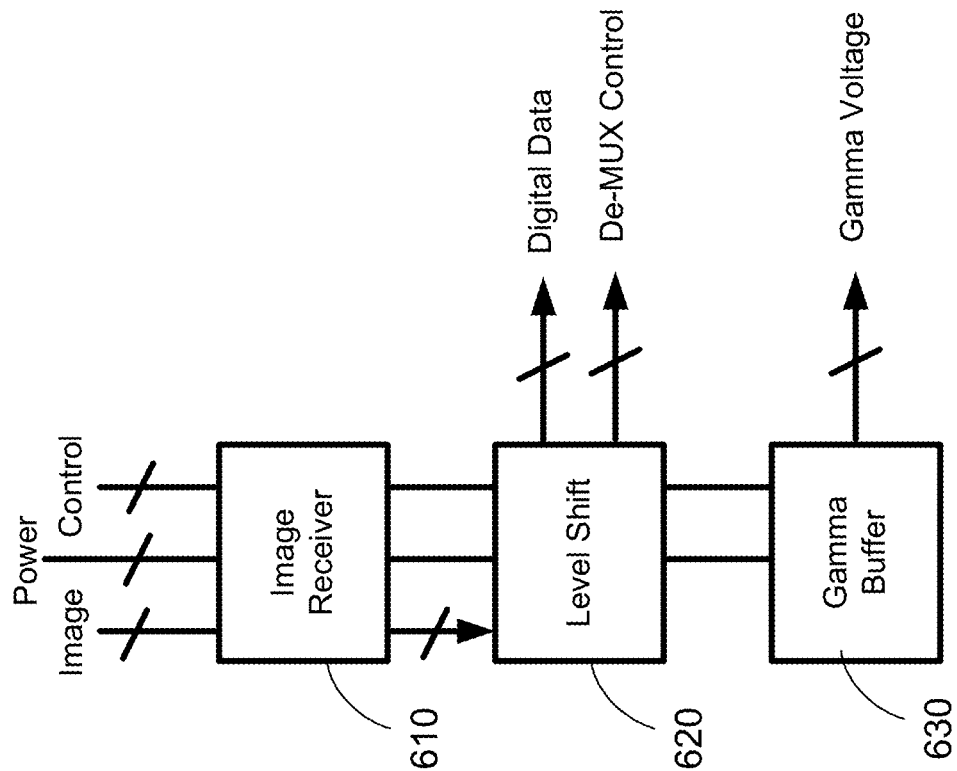
FIG. 6B schematically shows a function block diagram of the micro-chip B as shown in FIG. 6A according to certain embodiments of the present disclosure.
Figure 6A:
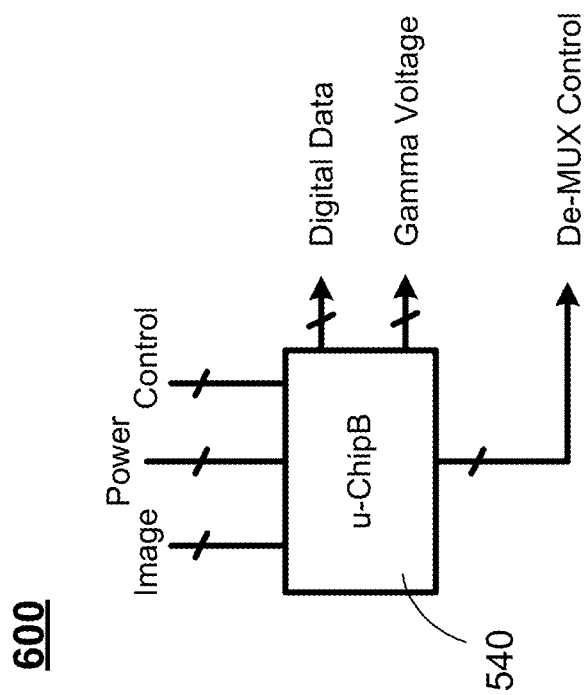
FIG. 6A schematically shows a micro-chip B as shown in FIG. 5B according to certain embodiments of the present disclosure.

FIGS. 6A and 6B schematically show a micro-chip B as shown in FIG. 5B and its function block according to certain embodiments of the present disclosure. Specifically, as shown in FIG. 6A, the micro-chip B 540 receives the image signal, the power voltage and the control signal from a host device, and generates the digital data signals, the gamma voltage signals and the de-MUX control signals. As shown in FIG. 6B, the micro-chip B 540 includes the image receiver module 610, the level shift module 620 and the gamma buffer module 630. Specifically, the image receiver module 610 is configured to receive the power voltage, the image signal and the control signal. The level shift module 620 is configured to generate the digital data signals based on the image signal, and to generate the de-MUX control signals based on the control signal. The gamma buffer module 630 is configured to generate the gamma voltage signals based on the control signal.

Figure 7A:
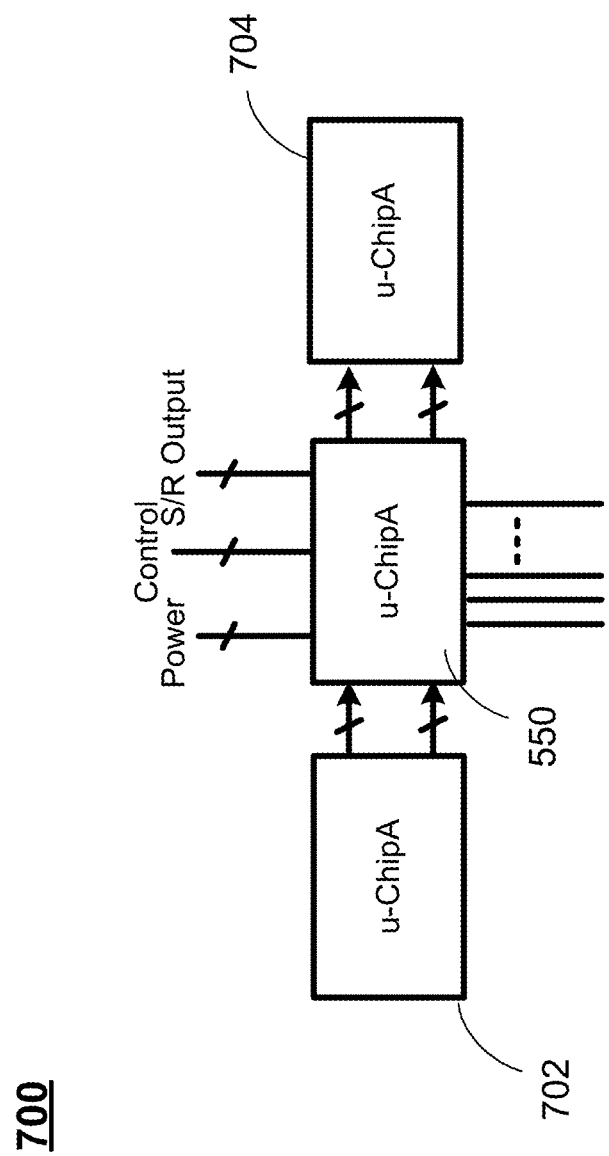
FIG. 7A schematically shows a micro-chip A as shown in FIG. 5B according to certain embodiments of the present disclosure.
Figure 7B:
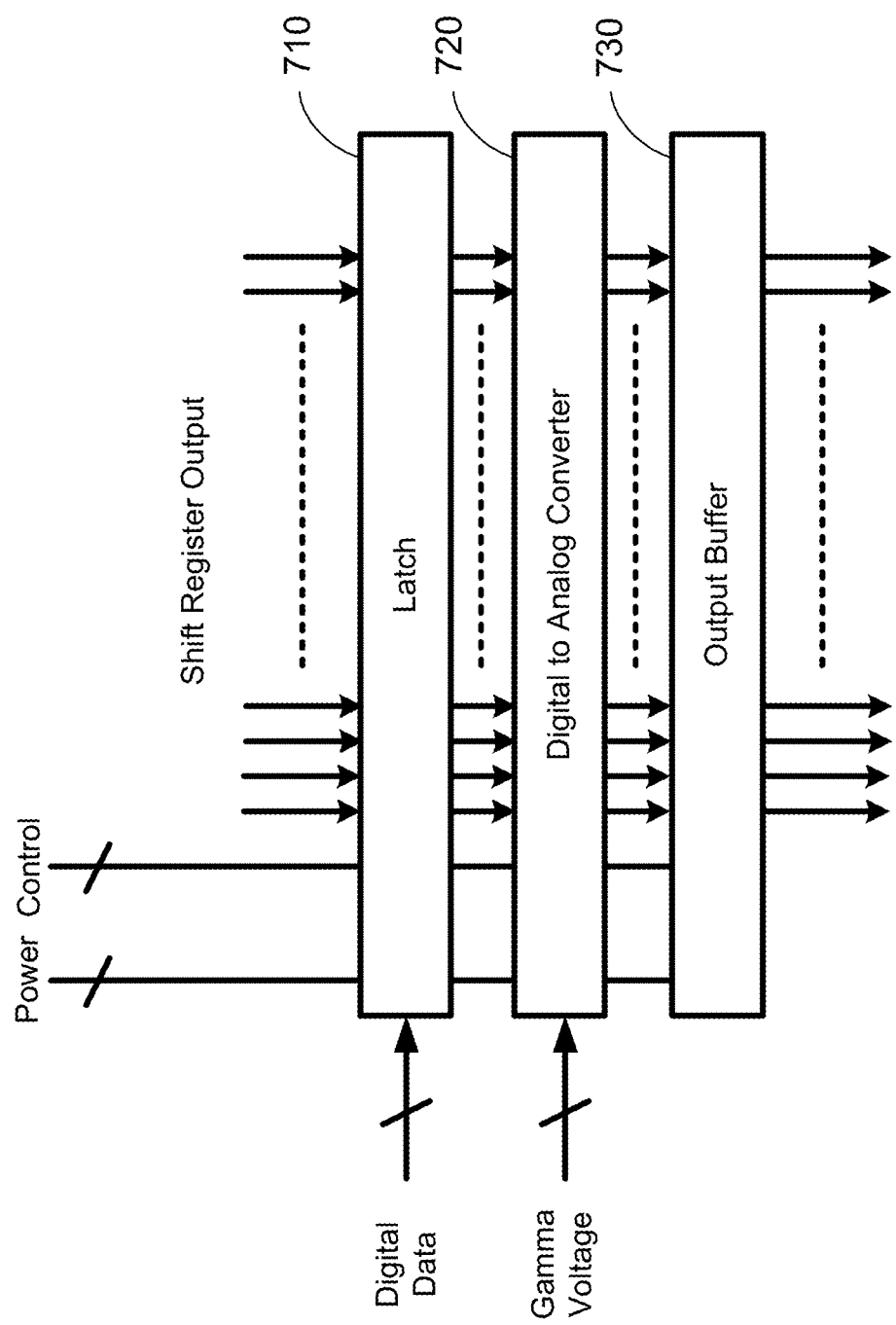
FIG. 7B schematically shows a function block diagram of the micro-chip A as shown in FIG. 7A according to certain embodiments of the present disclosure.

FIGS. 7A and 7B schematically show a micro-chip A as shown in FIG. 5B and its function block according to certain embodiments of the present disclosure. Specifically, FIG. 7A shows a micro-chip A 550 in a current stage as well as a micro-chip A 702 in a previous stage and a micro-chip A 704 in a next stage. The micro-chip A 550 in the current stage receives the power voltage and the control signal from the host device as well as the shift register output signals from the TFT-based shift register circuit 560 (not shown in FIG. 7A) and the digital data signals and the gamma voltage signals from the micro-chip A 702 in the previous stage, and sends the analog data signals and the gamma voltage signals to the micro-chip A 704 in the next stage. As shown in FIG. 7B, the micro-chip A 550 in the current stage includes the latch module 710, the DAC module 720, and the output buffer module 730. Specifically, the latch module 710 is configured to receive the digital data signals from the micro-chip A 702 in the previous stage, the power voltage and the control signal, and shift register output signals generated by the TFT-based shift register circuit 560. The DAC module 720 receives the gamma voltage signals from the micro-chip A 702 in the previous stage, and converts the digital data signals to the analog data signals, and sends the analog data signals to the output buffer module 730 for buffering and outputting.

Figure 8A:
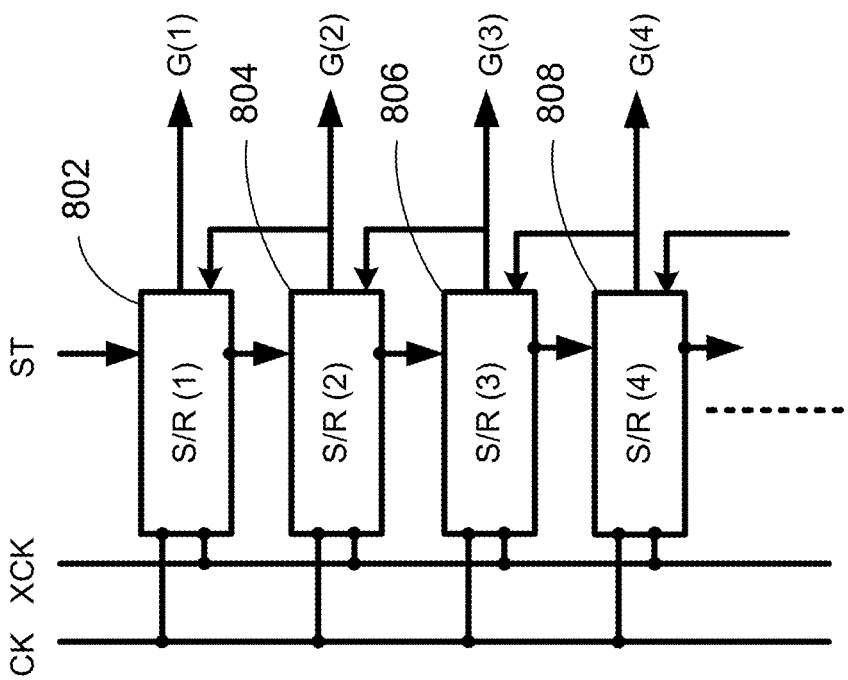
FIG. 8A schematically shows a shift register circuit according to certain embodiments of the present disclosure.
Figure 8B:
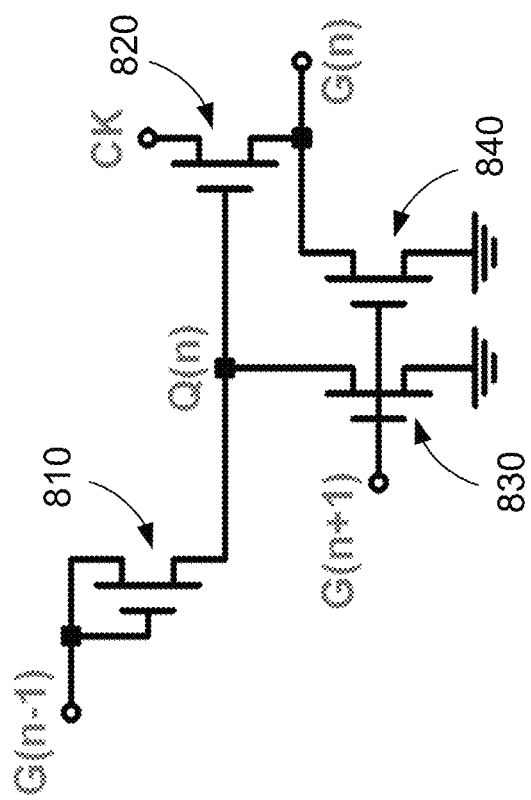
FIG. 8B schematically shows a TFT-based shift register as shown in FIG. 8A according to certain embodiments of the present disclosure.

FIG. 8A schematically shows a shift register circuit according to certain embodiments of the present disclosure. As shown in FIG. 8A, the shift register circuit 800 is formed by multiple shift registers 802, 804, 806 and 808 sequentially arranged in different stages, and each shift register S/R(n) generates a corresponding output signal G(n). FIG. 8B schematically shows a TFT-based shift register S/R(n) as shown in FIG. 8A. As shown in FIG. 8B, the TFT-based shift register S/R(n) is in the stage n, and includes four transistors 810, 820, 830 and 840, and each of the transistors includes a first end, a second end and a control end. Specifically, the first end and the control end of the first transistor 810 are configured to receive a previous corresponding output signal G(n−1) of a previous TFT-based shift register S/R(n−1), and the second end of the first transistor 810 is electrically connected to a node Q(n). The first end of the second transistor 820 is configured to receive a clock signal CK, the second end of the second transistor 820 is an output end configured to output the corresponding output signal G(n), and the control end of the second transistor 820 is electrically connected to the node Q(n). The first end of the third transistor 830 is electrically connected to the node Q(n), and the first end of the fourth transistor 840 is electrically connected to the output end. The second ends of the third transistor 830 and the fourth transistor 840 are grounded, and the control ends of the third transistor 830 and the fourth transistor 840 are configured to receive a next corresponding output signal G(n+1) of a next TFT-based shift register S/R(n+1).

Figure 8C:
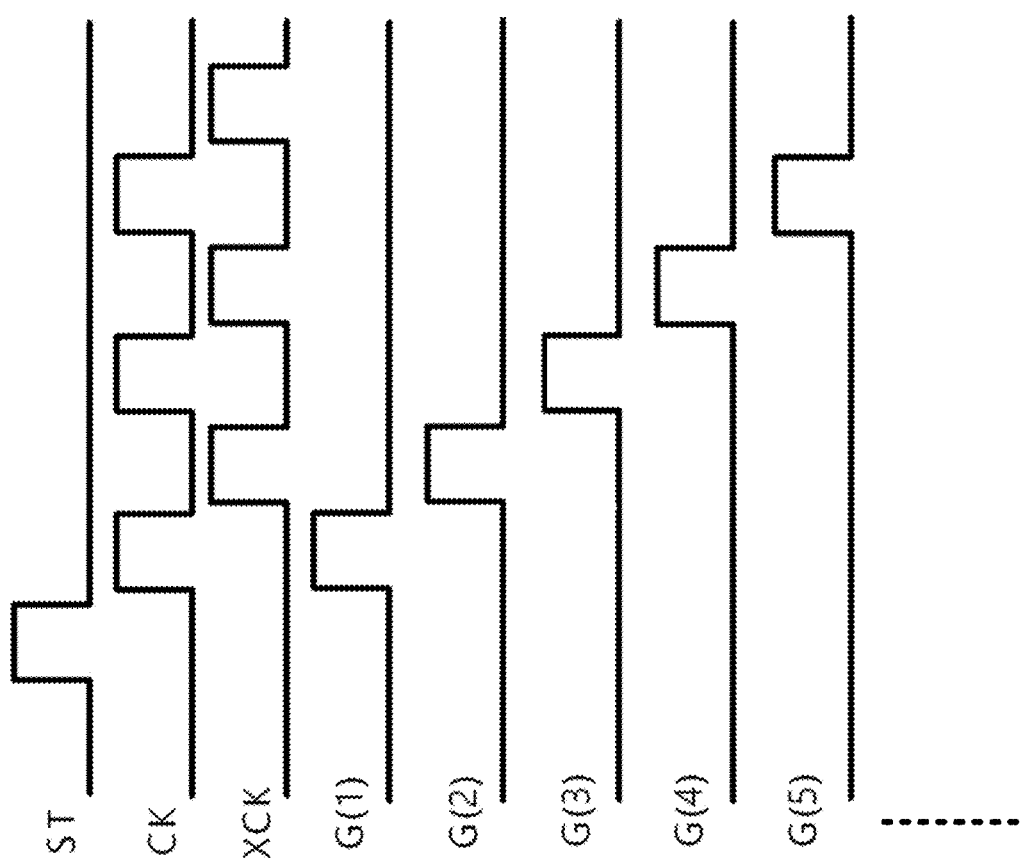
FIG. 8C schematically shows signals of the TFT-based shift register as shown in FIG. 8B according to certain embodiments of the present disclosure.

FIG. 8C schematically shows signals of the TFT-based shift register as shown in FIG. 8B according to certain embodiments of the present disclosure. As shown in FIG. 8C, at the start of the process, a start pulse ST is provided for the TFT-based shift register S/R(1), as there is no previous TFT-based shift register for the TFT-based shift register S/R(1). In other words, the start pulse ST functions as the output signal G(0). When the start pulse ST is provided, the first transistor 810 of the TFT-based shift register S/R(1) is turned on to charge the node Q(1), such that the second transistor 820 of the TFT-based shift register S/R(1) is turned on. In the next period, the clock signal CK is in the high level, such that the TFT-based shift register S/R(1) is turned on generates the output signal G(1). In the next period, the TFT-based shift register S/R(2) will also be triggered to generate the output signal G(2), which turns on the third transistor 830 and the fourth transistor 840 of the TFT-based shift register S/R(1). In this case, the node Q(2) and the output signal G(1) will be discharged. In this case, the TFT-based shift register S/R(n) will sequentially generate the output signals G(n).

Figure 9A:
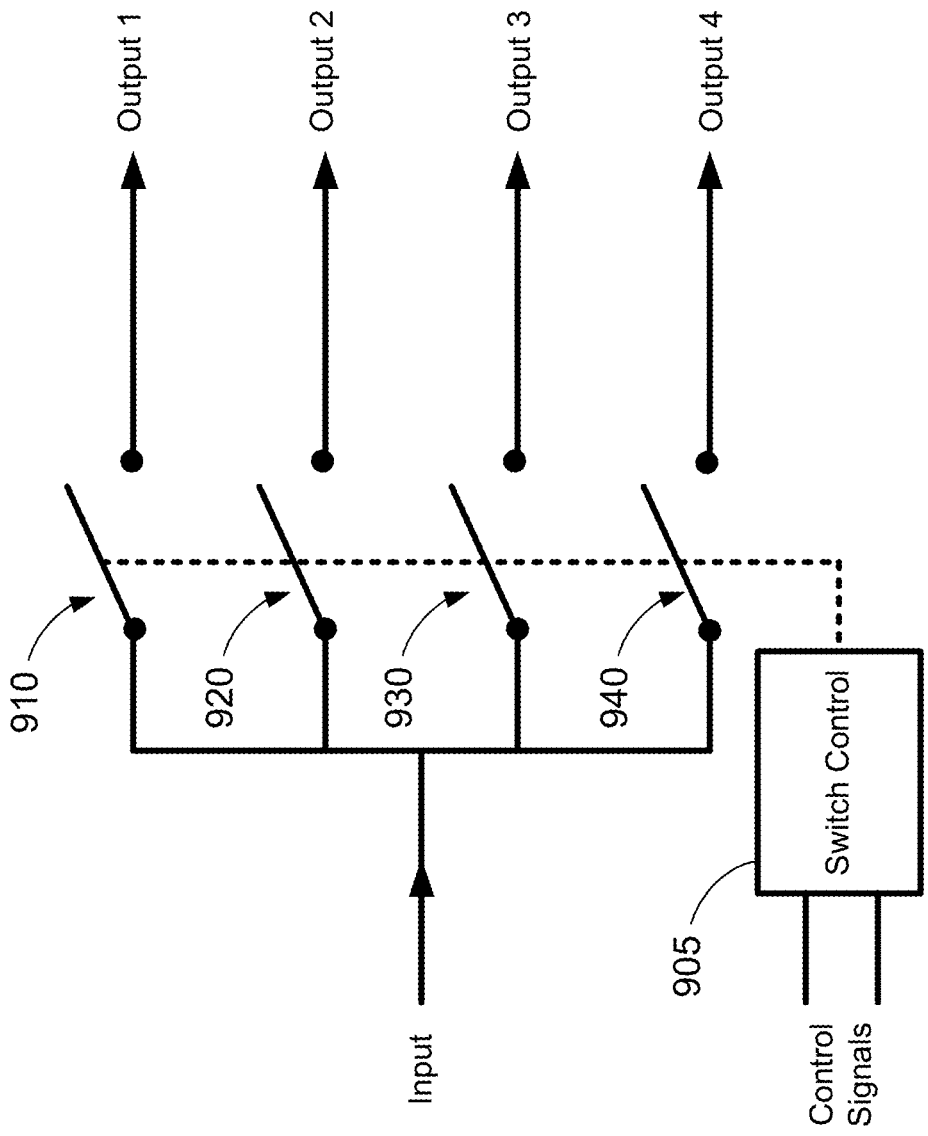
FIG. 9A schematically shows a de-MUX circuit according to certain embodiments of the present disclosure.
Figure 9B:
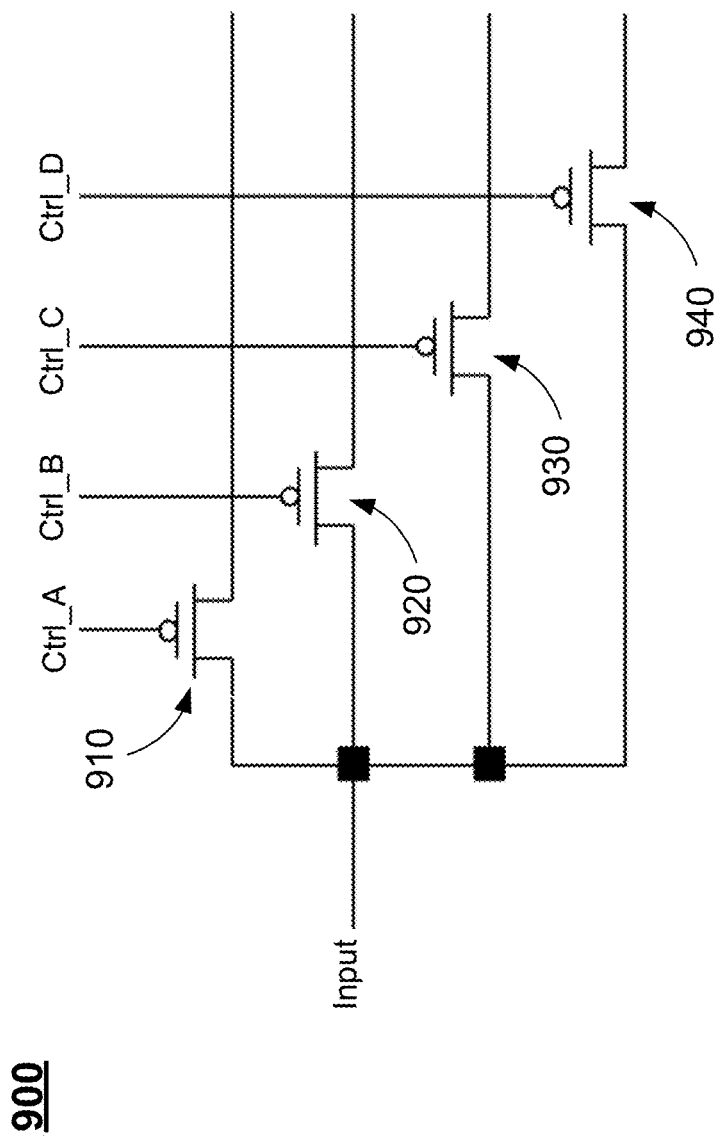
FIG. 9B schematically shows a TFT-based de-MUX circuit as shown in FIG. 9A according to certain embodiments of the present disclosure.
Figure 9C:
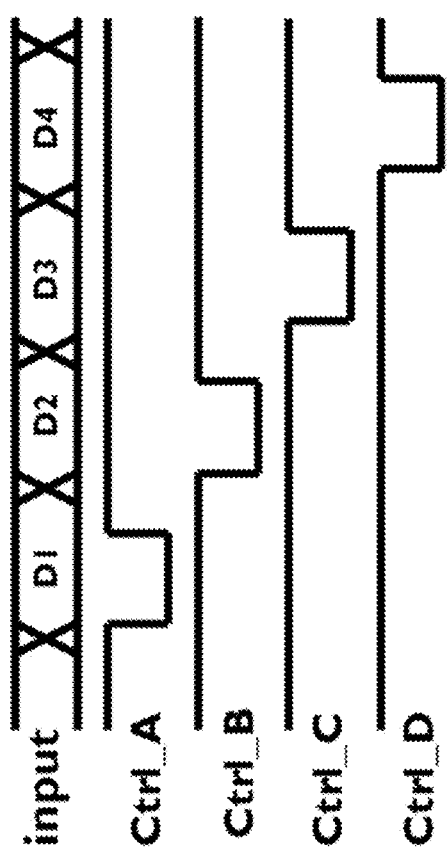
FIG. 9C schematically shows signals of the TFT-based de-MUX circuit as shown in FIG. 9B according to certain embodiments of the present disclosure.

FIG. 9A schematically shows a de-MUX circuit according to certain embodiments of the present disclosure, and FIG. 9B shows a TFT-based de-MUX circuit as shown in FIG. 9A. Specifically, a de-MUX circuit is a circuit taking a single input and selectively provide multiple output signals. As shown in FIG. 9A, the de-MUX circuit includes multiple switches 910, 920, 930 and 940, as well as a switch control module 905 to control the switches 910, 920, 930 and 940. As shown in FIG. 9B, each of the switches 910, 920, 930 and 940 can be implemented by a TFT, and the TFTs 910, 920, 930 and 940 may be respectively controlled by corresponding control signals Ctrl_A, Ctrl_B, Ctrl_C and Ctrl_D. FIG. 9C schematically shows signals of the TFT-based de-MUX circuit as shown in FIG. 9B according to certain embodiments of the present disclosure. As shown in FIG. 9C, the input signal may include data signals for four data lines D1, D2, D3 and D4, and the control signals Ctrl_A, Ctrl_B, Ctrl_C and Ctrl_D may include a pulse corresponding to the respective periods for the four data lines D1, D2, D3 and D4. In each of the respective periods for the four data lines D1, D2, D3 and D4, the corresponding control signal turns on the corresponding switch, such that the input signal will be transmitted to the corresponding data line. For example, in the first period, the control signal Ctrl_A turns on the switch 910, such that the input signal is transmitted to the corresponding data line D1 as the data signal; in the second period, the control signal Ctrl_B turns on the switch 920, such that the input signal is transmitted to the corresponding data line D2 as the data signal; in the third period, the control signal Ctrl_C turns on the switch 930, such that the input signal is transmitted to the corresponding data line D3 as the data signal; and in the fourth period, the control signal Ctrl_D turns on the switch 940, such that the input signal is transmitted to the corresponding data line D4 as the data signal.

It should be noted that the de-MUX circuit as shown in FIGS. 9A and 9B include only a single one-to-four de-MUX circuit. As shown in FIG. 5B, the TFT-based de-MUX circuit 570 receives multiple data signals from the micro-chips A 550 in multiple stages. Thus, the TFT-based de-MUX circuit 570 may include multiple de-MUX circuits 900 as shown in FIG. 9B, and each of the MUX circuits 900 corresponds to one output signal of a corresponding micro-chip A 550.

Figure 10A:
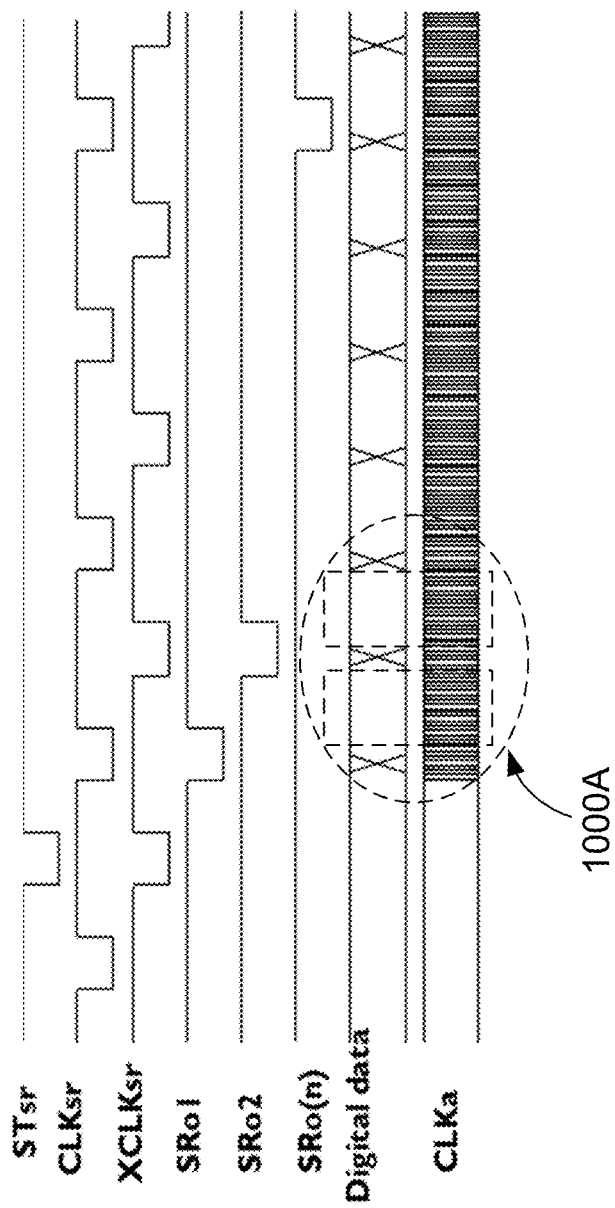
FIG. 10A schematically shows the signals for the driving module as shown in FIG. 5B according to certain embodiments of the present disclosure.
Figure 10B:
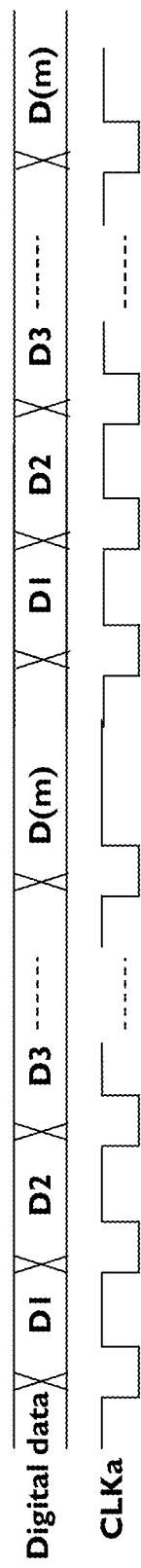
FIG. 10B schematically shows details of the digital data signal and the clock signal CLKa as shown in FIG. 10A according to certain embodiments of the present disclosure.

FIG. 10A and FIG. 10B schematically show the signals for the driving module as shown in FIG. 5B according to certain embodiments of the present disclosure. Specifically, the signal STsr refers to the start pulse of the shift registers; the signals CLKsr and XCLKsr refer to the clock signals of the shift registers; the signals SRo1, SRo2, . . . , SRo(n) refers to the shift register output signals; the digital data signal refers to the signal generated by the micro-chip B; and the signal CLKa refers to a clock signal, which is used to synchronize the signals in the data stacking process. As shown in FIG. 10B, for each of the digital data signals D1, D2, D3, . . . D(m), the clock signal CLKa provides a corresponding pulse to facilitate synchronization of the signals.

Figure 11:
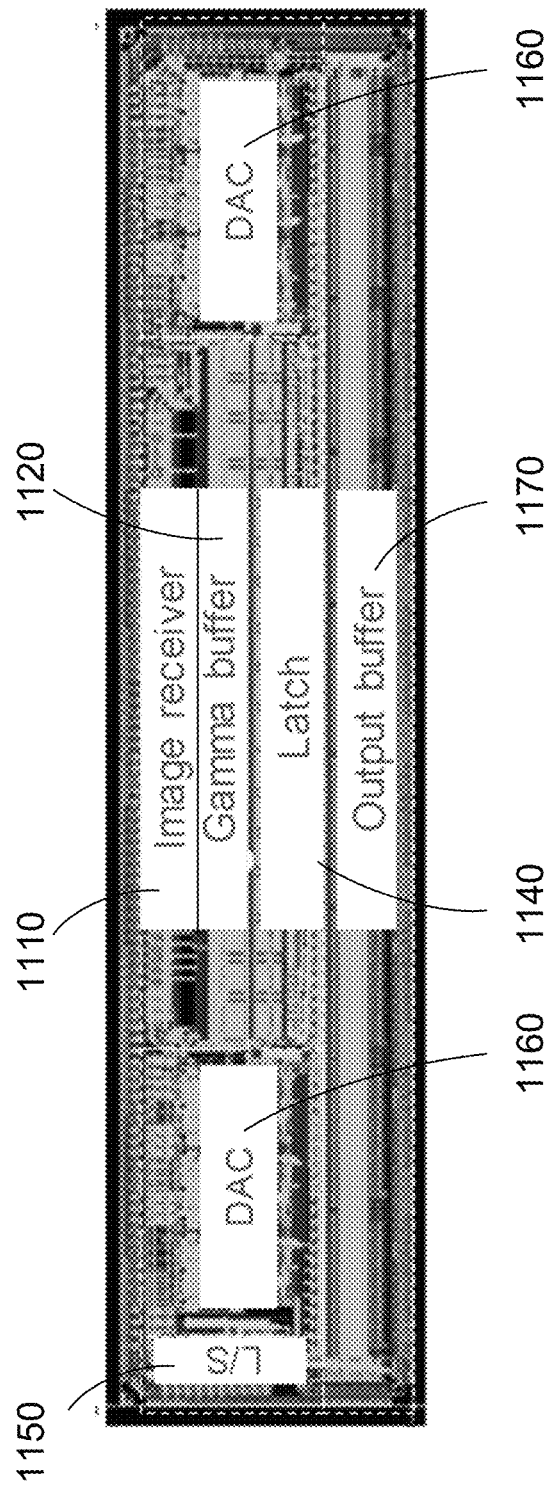
FIG. 11 schematically shows the modules of a driver IC according to certain embodiments of the present disclosure.

FIG. 11 schematically shows the modules of a driver IC according to certain embodiments of the present disclosure. As shown in FIG. 11, the driver IC 1100 is a single driver IC which provides all of the functions as shown in FIG. 2, including the image receiver module 1110, the gamma buffer module 1120, the latch module 1140, the level shift module 1150, the DAC module 1160 and the output buffer module 1170. It should be noted that the shift register module 230 as shown in FIG. 2 is not identified in FIG. 11 because the shift register function is now replaced by the TFT-based shift register circuit 560 as shown in FIG. 5B, and thus is not provided by the driver IC 1110. Referring to in FIG. 6B, the micro-chip B 540 includes the image receiver module 610, the level shift module 620 and the gamma buffer module 630. As shown in FIG. 11, the image receiver module 1110, the gamma buffer module 1120 and the level shift module 1150 occupies about 20% of the total area of the driver IC 1100. In other words, the total area of the modules of the micro-chip B is about 20% of the total area of the driver IC 1100. The other modules corresponding to the micro-chips A, including the latch module 1140, the DAC module 1160 and the output buffer module 1170 occupies about 80% of the total area of the driver IC 1100. In other words, the total area of the modules of all of the micro-chip A is about 80% of the total area of the driver IC 1100.

FIG. 12 shows a table of the micro-chip sizes and the corresponding lithography processes of the micro-chips A and B according to certain embodiments of the present disclosure. Generally, in addition to the function modules, the size of each micro-chip is determined by the corresponding lithography process being used in its manufacturing process. For example, when a superior lithography process is adopted, the micro-chip being manufactured may have a reduced size. In certain embodiments, the micro-chip B can be manufactured by a first lithography process, and each of the micro-chips A can be manufactured by a second lithography process. The first and second lithography processes may be identical or different processes.

As discussed above, the total area of the modules of the micro-chip B is about 20% of the total area of the driver IC 1100, and the total area of the modules of all of the micro-chip A is about 80% of the total area of the driver IC 1100. Thus, when the number of the micro-chips A is X, the size of each micro-chip A is about (80/X) %. As shown in FIG. 12, in example 1, both the first and second lithography processes are the 55-nm lithography process. In this case, to obtain about the same size of the micro-chips A and B, four micro-chips A should be provided, such that the size of each micro-chip A is about 20% (=80%/4) of the total area of the driver IC 1100. Further, the lithography process used for manufacturing the micro-chip B can be a superior lithography process, such as the 18-nm lithography process or other extreme ultraviolet (EUV) lithography process. In this case, as shown in example 2, the size of the micro-chip B will be about 8% of the total area of the driver IC 1100. Thus, to obtain about the same size of the micro-chips A and B, ten micro-chips A should be provided, such that the size of each micro-chip A is about 8% (=80%/10) of the total area of the driver IC 1100.

As discussed above, by provide two types of micro-chips A and B in the driver module, only one micro-chip B is required to include the image receiver module, the level shift module and the gamma buffer module, and the other micro-chips A may provide the latch module, the DAC module and the output buffer module. Thus, by controlling the size of the micro-chip B, the quantity of the micro-chips A can be determined to increase the flexibility and bendability of the display module, without significantly increasing the manufacturing cost and process for the whole display module.

In one aspect, the display module as described in the embodiments above may be used in a portable device, such that the portable device may be foldable and bendable.

The embodiments of the display modules as described above may be used in different types of display devices and/or display apparatuses, such as LCD or OLED display devices. Further, the embodiments as described above are provided for the purposes of illustration and description. Although certain features may be described in different embodiments respectively, these features may be combined altogether to form other embodiments without departing from the spirit and scope of the disclosure.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display module, comprising:
   a display panel defining a display area and a peripheral area thereon, wherein the display panel is flexible and bendable; and
   a driving module disposed in the peripheral area, comprising:
      a first micro-chip configured to receive an image signal and a control signal, to generate digital data signals based on the image signal, and to generate demultiplexer (de-MUX) control signals and gamma voltage signals based on the control signal;
      a plurality of second micro-chips, coupled to the first micro-chip and sequentially coupled to one another, configured to receive a plurality of shift register output signals, to receive the digital data signals and the gamma voltage signals from the first micro-chip, and to generate analog data signals based on the digital data signals;
      a transistor-based shift register circuit coupled to the first micro-chip and the second micro-chips, configured to generate the shift register output signals for the second micro-chips;
      a transistor-based de-MUX circuit coupled to the first micro-chip and the second micro-chips, configured to receive the analog data signals from the second micro-chips and send the analog data signals to a plurality of data lines,
   wherein the first micro-chip and the second micro-chips are disposed in a straight line in the peripheral area, each of the first micro-chip and the second micro-chips has a width W along the straight line, and a distance D exists between two adjacent chips of the first micro-chip and the second micro-chips along the straight line.

2. The display module of claim 1, wherein the display panel is an active matrix display panel.

3. The display module of claim 1, wherein a bendability of the display panel is determined by the width W and the distance D.

4. The display module of claim 1, wherein the first micro-chip comprises:
   an image receiver module configured to receive a power voltage, the image signal and the control signal;
   a level shift module configured to generate the digital data signals and the de-MUX control signals; and
   a gamma buffer module configured to generate the gamma voltage signals.

5. The display module of claim 1, wherein each of the second micro-chips comprises:
   a latch module configured to receive the power voltage, the control signal, the digital data signal outputted by the first micro-chip and the shift register output signals;
   a digital to analog converter (DAC) module configured to receive the gamma voltage signals and to convert the digital data signals to the analog data signals; and
   an output buffer module configured to buffer the analog data signals for the de-MUX circuit.

6. The display module of claim 1, wherein the transistor-based shift register circuit comprises a plurality of thin-film transistor (TFT)-based shift registers sequentially arranged in a plurality of stages, and each of the TFT-based shift registers is configured to sequentially output a corresponding output signal G(n) of the shift register output signals, wherein n is a positive integer indicating a corresponding stage of each of the TFT-based shift registers.

7. The display module of claim 6, wherein each of the TFT-based shift registers comprises:
   a first transistor having a first end, a second end and a control end, wherein the first end and the control end are configured to receive a previous corresponding output signal G(n−1) of a previous TFT-based shift register, and the second end is electrically connected to a node;
   a second transistor having a first end, a second end and a control end, wherein the first end is configured to receive a clock signal, the second end is an output end configured to output the corresponding output signal G(n), and the control end is electrically connected to the node;
   a third transistor having a first end, a second end and a control end, wherein the first end is electrically connected to the node, the second end is grounded, and the control end is configured to receive a next corresponding output signal G(n+1) of a next TFT-based shift register; and
   a fourth transistor having a first end, a second end and a control end, wherein the first end is electrically connected to the output end, the second end is grounded, and the control end is configured to receive the next corresponding output signal G(n+1) of the next TFT-based shift register.

8. The display module of claim 1, wherein the transistor-based de-MUX circuit comprises a plurality of thin-film transistor (TFT) switches, each of the TFT switches has a first end connected to a corresponding one of the second micro-chips to receive the analog data signals as the input signals of the transistor-based de-MUX circuit, a second end connected to a corresponding one of the data lines, and a control end connected to the first micro-chip to receive one of the de-MUX control signals.

9. The display module of claim 1, wherein the first micro-chip is manufactured by a first lithography process, and the second micro-chips is manufactured by a second lithography process.

10. The display module of claim 9, wherein the second lithography process is an advanced lithography process superior to the first lithography process, such that the first micro-chip and the second micro-chips have about the same width W.

11. The display module of claim 10, wherein the second lithography process is a 18-nm lithography process, and the first lithography process is a 55-nm lithography process.

12. The display module of claim 1, wherein the display panel is a liquid crystal display (LCD) panel.

13. The display module of claim 1, wherein the display panel is an organic light emitting diode (OLED) display panel.

14. A portable device, having the display module of claim 1.

* * * * *